US008159795B2

(12) United States Patent
Nakamura

(10) Patent No.: US 8,159,795 B2
(45) Date of Patent: Apr. 17, 2012

(54) PROTECTION CIRCUIT FOR SEMICONDUCTOR INTEGRATED CIRCUIT AND DRIVING METHOD THEREFOR

(75) Inventor: Hiroyuki Nakamura, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 347 days.

(21) Appl. No.: 12/466,618

(22) Filed: May 15, 2009

(65) Prior Publication Data

US 2009/0284882 A1 Nov. 19, 2009

(30) Foreign Application Priority Data

May 19, 2008 (JP) ................................. 2008-130828
Apr. 28, 2009 (JP) ................................. 2009-109392

(51) Int. Cl.
*H02H 9/00* (2006.01)
*H02H 3/00* (2006.01)
(52) U.S. Cl. .......................................... 361/56; 361/45
(58) Field of Classification Search .................... 361/45, 361/56
See application file for complete search history.

(56) References Cited

U.S. PATENT DOCUMENTS

| | | | |
|---|---|---|---|
| 2003/0011949 A1* | 1/2003 | Ker et al. | 361/56 |
| 2004/0174648 A1* | 9/2004 | Frey et al. | 361/90 |
| 2004/0189275 A1 | 9/2004 | Yoneyama | 323/315 |
| 2008/0042686 A1 | 2/2008 | Otsuka et al. | 326/30 |
| 2009/0085117 A1* | 4/2009 | Harada et al. | 257/360 |
| 2010/0123984 A1* | 5/2010 | Lin | 361/56 |
| 2010/0208399 A1* | 8/2010 | Yu et al. | 361/56 |

FOREIGN PATENT DOCUMENTS

| | | |
|---|---|---|
| JP | 5-021714 A | 1/1993 |
| JP | 2000-058666 A | 2/2000 |
| JP | 2003-338739 A | 11/2003 |

* cited by examiner

*Primary Examiner* — Jared Fureman
*Assistant Examiner* — Scott Bauer
(74) *Attorney, Agent, or Firm* — Fitzpatrick, Cella, Harper & Scinto

(57) ABSTRACT

A surge protection circuit comprises a surge detection circuit 14 for detecting a surge applied to a semiconductor integrated circuit, and a protection element 15 for absorbing the surge. The protection element is connected between a signal terminal for supplying a signal to the semiconductor integrated circuit and a power source terminal for supplying a power source voltage. When the power source voltage is not larger than a voltage enough to normally operate the semiconductor integrated circuit and the surge detection circuit does not detect the surge, the protection element is set in a current limiting state. When the power source voltage is not larger than a voltage enough to normally operate the semiconductor integrated circuit and the surge detection circuit detects the surge, the protection element is set in a current non-limiting state.

6 Claims, 6 Drawing Sheets

PROTECTION CIRCUIT FOR SEMICONDUCTOR INTEGRATED CIRCUIT AND DRIVING METHOD THEREFOR

BACKGROUND OF THE INVENTION

1. Field of the Invention

The present invention relates to a protection circuit for a semiconductor integrated circuit and a driving method therefore, and in particular, to a protection circuit that protects a semiconductor integrated circuit or a system comprising a plurality of semiconductor integrated circuits against a surge, and a driving method for the protection circuit.

2. Description of the Related Art

Environmental problem is concerned in a various field of technology these days, and a reduction of $CO_2$ is required for example. In such circumstances, a technique is required to reduce as much power consumption as possible in electric and electronic devices. Recent electric and electronic devices comprises a plurality of semiconductor integrated circuits (referred to as IC hereinafter), and for the above purpose to reduce power consumption, a technique in which a voltage source is not applied to an IC which is not used is employed. In many applications, a controlling IC which controls the system is kept at an operating state, whereas another IC is supplied with voltage source only when needed. Supposing that the controlling IC is IC2, the another IC is IC1.

Conventionally known protection circuits for semiconductor integrated circuits include, for example, one utilizing a PN junction diode as disclosed in Japanese Patent Application Laid-Open No. H05-021714 and one utilizing the snapback characteristics of MOSFETs as disclosed in Japanese Patent Application Laid-Open No. 2000-058666.

FIG. 7 illustrates conventional system connections used to apply different power source voltages to two ICs, IC1 and IC2. FIG. 7 illustrates an example in which a PN junction diode is used as a protection circuit.

When power sources for IC1 and IC2 are controlled by respective systems, rise timings for the power source voltages of the respective systems may fail to coincide with each other. Then, one of the power source voltages may rise earlier. In this case, for example, a power source voltage Vcc1 for IC1 is not applied and is at a ground potential (GND). A power source voltage Vcc2 for IC2 has already been applied. Thus, a buffer output from IC2 is at a high level, that is, IC2 outputs the power source voltage Vcc2. At this time, the power source voltage Vcc2 is applied to a protection diode D1 for IC1. That is, a voltage of at least several V is applied to the protection diode D1 in a forward direction. Thus, a current of several amperes may flow through the protection diode D1 to thermally break down the protection diode D1. When the protection diode D1 is broken down, the system may fail to operate.

FIG. 8 illustrates an example of system connections in which a MOSFET is used as a protection circuit for IC1. Also in this case, a similar phenomenon may occur because of a parasitic PN diode D1 present between a back gate and a drain of the protection PMOSFET. Moreover, the flow of the large current may cause a PNPN structure present in a CMOS process to be latched up.

To prevent an excessive current from flowing through the protection element and to prevent the possible latch-up, the following measures are conventionally taken.

(1) A power source sequence applied to each IC is controlled.

(2) A series resistor is placed in a terminal to which a voltage equal to or higher than the power source voltage may be applied.

However, disadvantageously, the measure in (1) increases system costs, and the measure in (2) cannot be used for a high-speed interface.

SUMMARY OF THE INVENTION

An object of the present invention is to solve the above-described problems and to hold the ability to provide protection against a surge.

The present invention provides a protection circuit for protecting a semiconductor integrated circuit against a surge, the protection circuit including: a surge detection circuit for detecting the surge applied to the semiconductor integrated circuit, and a protection element for absorbing the surge, wherein the protection element is connected between a signal terminal for supplying a signal to the semiconductor integrated circuit and a power source terminal for supplying a power source voltage, when the power source voltage is not larger than a voltage enough to normally operate the semiconductor integrated circuit and the surge detection circuit does not detect the surge, the protection element is set in a current limiting state, and when the power source voltage is not larger than a voltage enough to normally operate the semiconductor integrated circuit and the surge detection circuit detects the surge, the protection element is set in a current non-limiting state.

Furthermore, the present invention provides a driving method for a protection circuit having a protection element arranged between a signal terminal for supplying a signal to a semiconductor integrated circuit and a power source terminal for supplying a power source voltage, the protection element absorbing a surge applied to the semiconductor integrated circuit, wherein when the power source voltage is not larger than a voltage enough to normally operate the semiconductor integrated circuit and the surge detection circuit does not detect the surge, the protection element is set in a current limiting state, and when the power source voltage is not larger than a voltage enough to normally operate the semiconductor integrated circuit and the surge detection circuit detects the surge, the protection element is set in a current non-limiting state.

The "surge" as used herein means a transient excessive voltage and a transient excessive current which are generated by static electricity and does not include a DC-based excessive voltage or current. Examples of the surge include a human body model for which electrostatic discharge from the human body is assumed and a machine model for which discharge from equipment is assumed; the models are used in electrostatic tests.

When the present invention is applied to a system using a plurality of ICs and a plurality of power sources, the need to control a power source sequence is eliminated. This also eliminates the need to provide a resistor for current limiting, thereby preventing high-speed operations from being hindered. Thus, the ability to provide protection against the surge can be held.

Further features of the present invention will become apparent from the following description of exemplary embodiments with reference to the attached drawings.

DESCRIPTION OF THE EMBODIMENTS

An exemplary embodiment of the present invention will be described below in detail with reference to the drawings.

Figure 1:
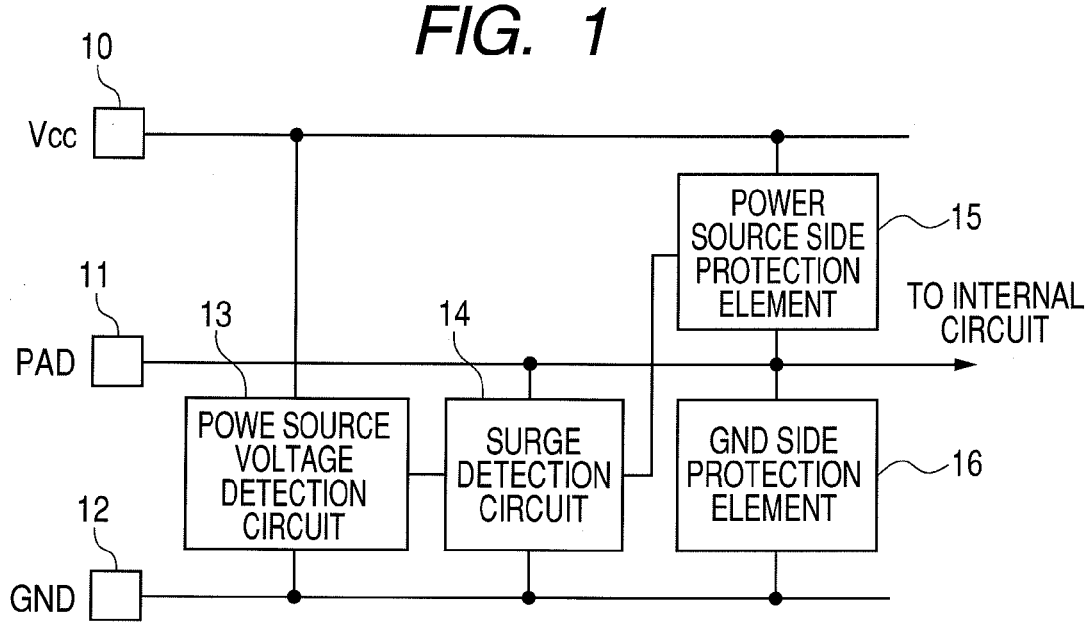
FIG. 1 is a block diagram of an exemplary embodiment of a protection circuit for a semiconductor integrated circuit according to the present invention.

FIG. 1 is a block diagram of an exemplary embodiment of a protection circuit for a semiconductor integrated circuit according to the present invention.

In FIG. 1, a power source pad (which serves as a power source terminal) 10 is connected to a power source (power source voltage Vcc). A GND pad 12 is set to the lowest reference voltage of a system (herein, GND). A pad 11 is connected to a surge detection circuit 14 (to serve as a signal terminal).

A power source voltage detection circuit 13 is connected between the power source pad 10 and the GND pad 12. The power source voltage detection circuit 13 outputs a power source voltage detection signal to the surge detection circuit 14 that detects a surge generated when static electricity is applied to an internal circuit (serving as a semiconductor integrated circuit).

The surge detection circuit 14 is connected to the pad (PAD) 11, serving as the signal terminal, and outputs a surge detection signal to a power source side protection element 15. The power source side protection element 15 is located between the power source pad 10 and the pad 11. A GND side protection element 16 is located between the pad 10 and a GND pad. The power source side protection element 15 and the GND side protection element 16 absorb the surge applied to the internal circuit (which serves as the semiconductor integrated circuit) to protect the internal circuit.

Example 1

Figure 2:
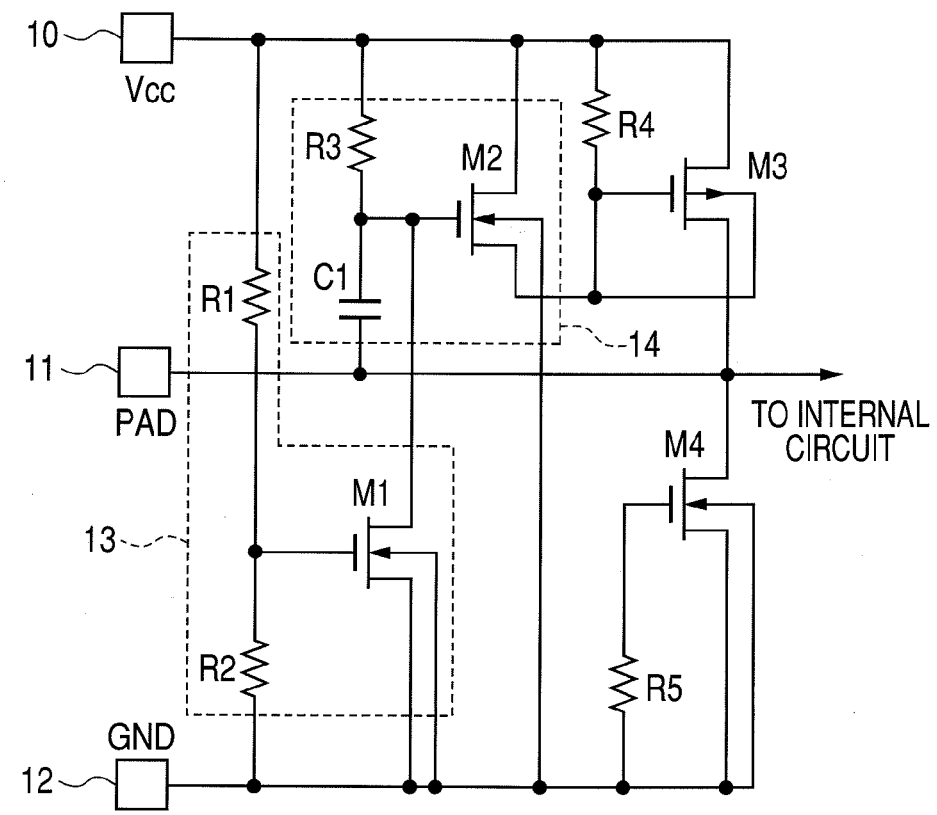
FIG. 2 is a circuit diagram of a protection circuit for a semiconductor integrated circuit in a first example according to the present invention.

FIG. 2 is a circuit diagram of a protection circuit for a semiconductor integrated circuit in a first example according to the present invention. In FIG. 2, a power source pad 10 is connected to a power source (power source voltage Vcc). A GND pad 12 is set to the lowest reference voltage of the system (herein, GND). A pad 11 is connected to a surge detection circuit 14. Resistors are illustrated at R1, R2, R3 and R4. A capacitance is illustrated at C1. NMOS transistors are illustrated at M1, M2 and M4. A PMOS transistor is illustrated at M3.

A power source voltage detection circuit 13 includes the resistors R1 and R2 and the NMOS transistor M1. The surge detection circuit, which detects a surge, includes the capacitance C1, the resistor R3 and the NMOS transistor M2. The PMOS transistor M3 and the resistor R4 serve as a power source side protection element. The NMOS transistor M4 and the resistor R5 serve as a GND side protection element for a ground potential.

One end of the resistor R1, provided in the power source voltage detection circuit 13, is connected to the power source pad 10. The other end of the resistor R1 is connected to one end of the resistor R2, the other end of which is connected to GND pad 12, and to a gate electrode of the NMOS transistor M1. A source electrode and a back gate electrode of the NMOS transistor M1 are connected to the GND. As described below, the voltage (power source voltage) of the power source pad 10 is divided by the resistors R1 and R2. The resulting voltage is applied to a gate of the NMOS transistor. A voltage that turns on the NMOS transistor M1 is determined by the resistance ratio of the resistors R1 and R2 and the threshold voltage of the NMOS transistor M1. The NMOS transistor M1 is turned on to allow the detection circuit to detect that the applied voltage is equal to or larger than the voltage at which the semiconductor integrated circuit operates properly.

One end of the capacitance C1, provided in the surge detection circuit 14, is connected to the pad 11, to a drain electrode of the PMOS transistor M3, and to a drain electrode of the NMOS transistor M4. A source electrode of the PMOS transistor M3 is connected to the power source pad 10. A source electrode of the NMOS transistor M4 is connected to the GND pad 12. The other end of the capacitance C1 is connected to one end of the resistor R3, the other end of which is connected to the power source pad 10, to a gate electrode of the NMOS transistor M2, and to a drain electrode of the NMOS transistor M1 which is an output of the power source voltage detection circuit 13.

A drain electrode of the NMOS transistor M2 is connected to the power source pad 10. A back gate electrode of the NMOS transistor M2 is connected to the GND pad 12. A source electrode of the NMOS transistor M2 is connected to one end of the resistor R4, the other end of which is connected to the power source pad 10, to a gate electrode of the PMOS transistor M3, and to a back gate electrode of the PMOS transistor M3.

In the above-described connection relationship, an assumed state in which voltages are input to the pads 10 and 11 will be described in connection with four cases.

(1) Power Source Non-Applied State in a Mounted-on-Substrate State

Figure 7:
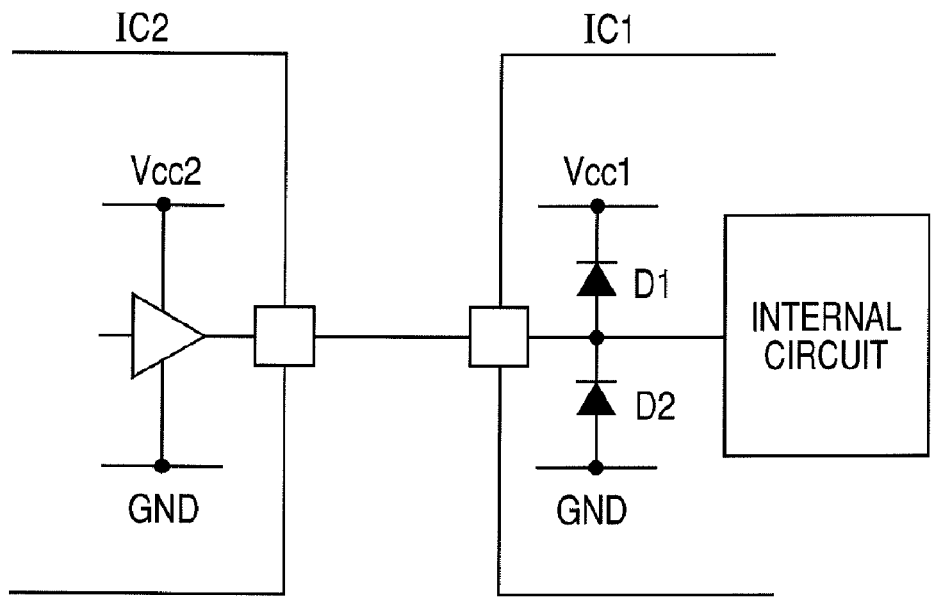
FIG. 7 is a diagram of system connections illustrating an example of a protection circuit for a conventional semiconductor integrated circuit.
Figure 8:
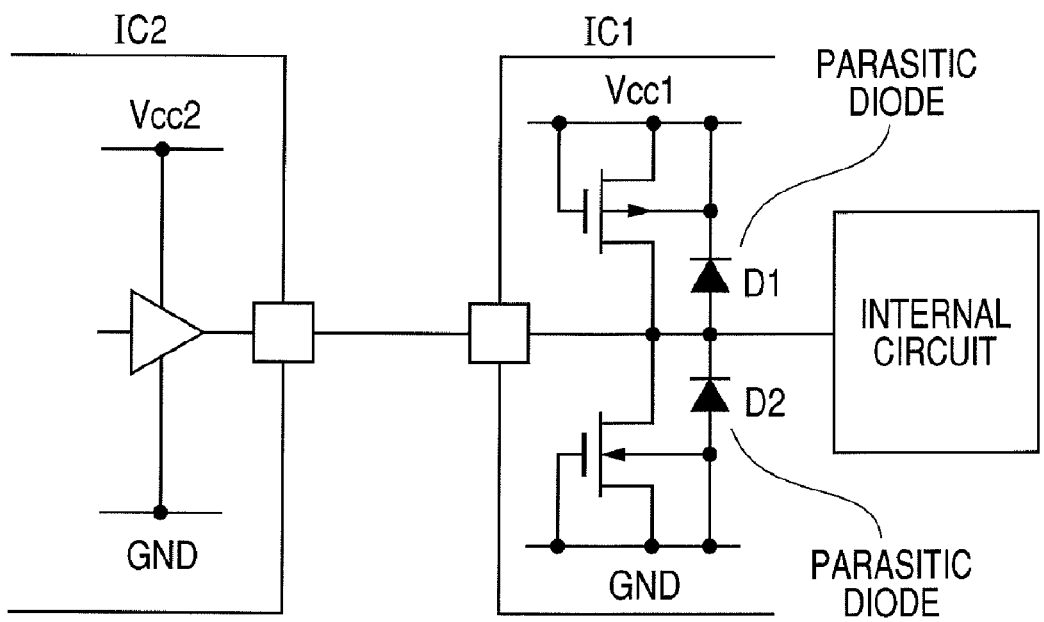
FIG. 8 is a diagram of system connections illustrating another example of a protection circuit for a conventional semiconductor integrated circuit.

In FIG. 2, the GND pad 12 is at the ground potential of the system. The power source pad 10 is connected to a power source. A power source voltage is applied to the power source pad 10 by a power source that drives an IC having an internal circuit and a protection circuit. As is the case of FIG. 7, the pad (PAD) 11 is connected to a different IC driven by a different power source.

Figure 3:
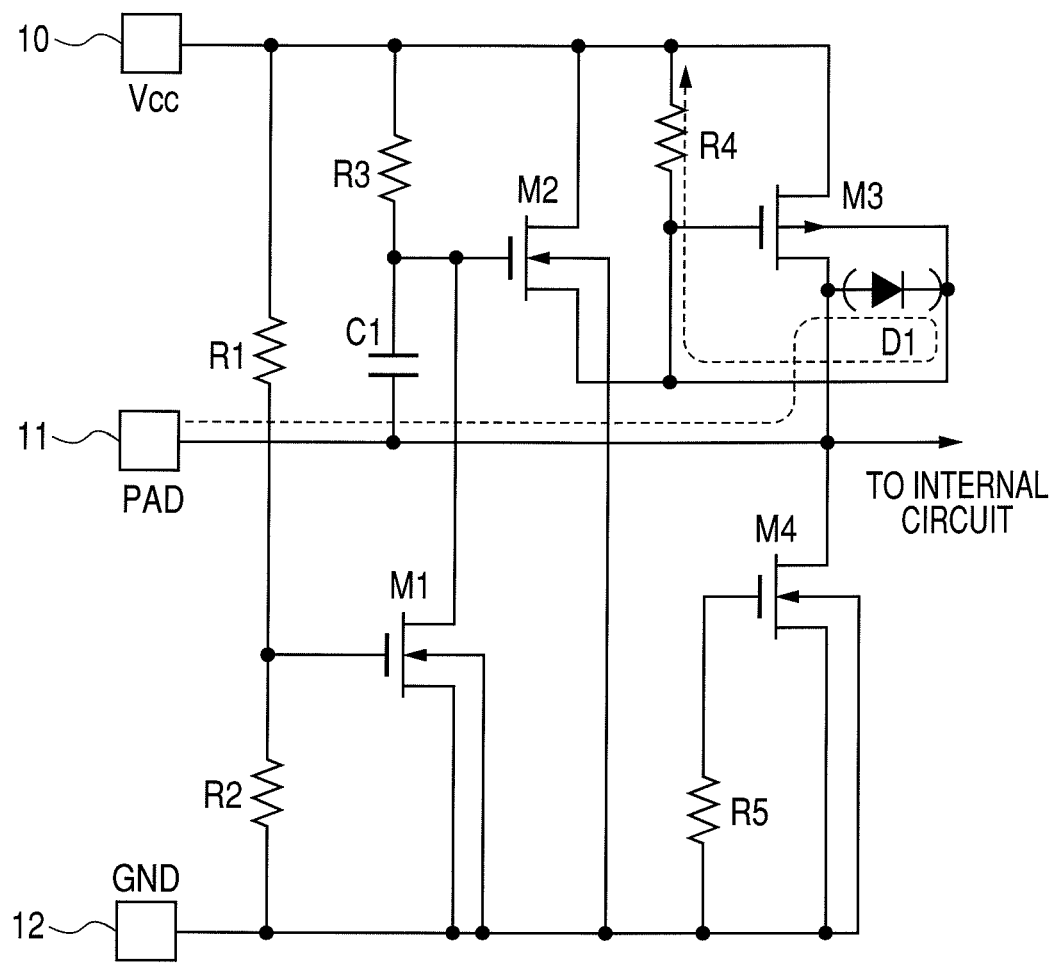
FIG. 3 is a circuit diagram illustrating a current path in the protection circuit for the semiconductor integrated circuit in the above-described example.

While the power source voltage is not applied, the power source pad 10 is at a GND level. At this time, when a DC voltage is applied to the pad 11 by the different IC, a current flows through a parasitic diode D1 formed between the drain and back gate of the PMOS transistor M3 as illustrated in FIG. 3. The current flows through the resistor R4. Thus, the value of the current is limited by the resistor R4, preventing the element from being damaged. At this time, no current flows through the MOS transistors other than the PMOS transistor M3. Almost no current flows between the source and drain of the PMOS transistor M3. That is, the protection element, including the resistor R4 and the PMOS transistor M3, is in a current limiting state.

(2) Power Source Applied State in the Mounted-on-Substrate State

While the power source voltage (Vcc) is being applied to the power source pad 10, the gate potential Vgm1 of the NMOS transistor M1 is:

$$Vgm1=Vcc \times R2/(R1+R2).$$

When the gate potential Vgm1 is set to at least the threshold voltage of the NMOS transistor M1, the NMOS transistor M1 is turned on. The gate potential of the NMOS transistor M2 is set to the GND level. Thus, the NMOS transistor M2 is turned off. The gate electrode of the PMOS transistor M3 is connected to the power source pad 10 (power source voltage Vcc) via the resistor R4. Since the power source pad 10 is set to the power source voltage (Vcc), even if the power source voltage of the different IC is applied to the pad 11, almost no current flows through a parasitic diode of the PMOS transistor M3 or the resistor R4. Furthermore, the gate electrode of the PMOS transistor M3 is set to the power source potential (Vcc). The gate electrode of the NMOS transistor M4 is set to the GND potential. Thus, no current flows through the PMOS transistor M3 or the NMOS transistor M4. That is, the protection element, including the resistor R4 and the PMOS transistor M3, is in the current limiting state.

(3) State Resulting from Application of a Surge that is Positive with Respect to Vcc in a Electrostatic Test Time Electrostatic tests are 2-terminal tests. If the tests are carried out with respect to Vcc (with respect to the power source pad), the power source pad 10 is set to the GND potential (0 V), and the GND pad 12 is open. When applied to the pad 11, a surge that is positive with respect to the potential of the power source pad 10 is provided to the gate electrode of the NMOS transistor M2 through the capacitance C1. Then, the positive surge provided to the gate electrode allows the NMOS transistor M2 to operate. The gate potential of the PMOS transistor M3 is lowered to the GND to set the PMOS transistor M3 in an electric continuous state.

Figure 4:
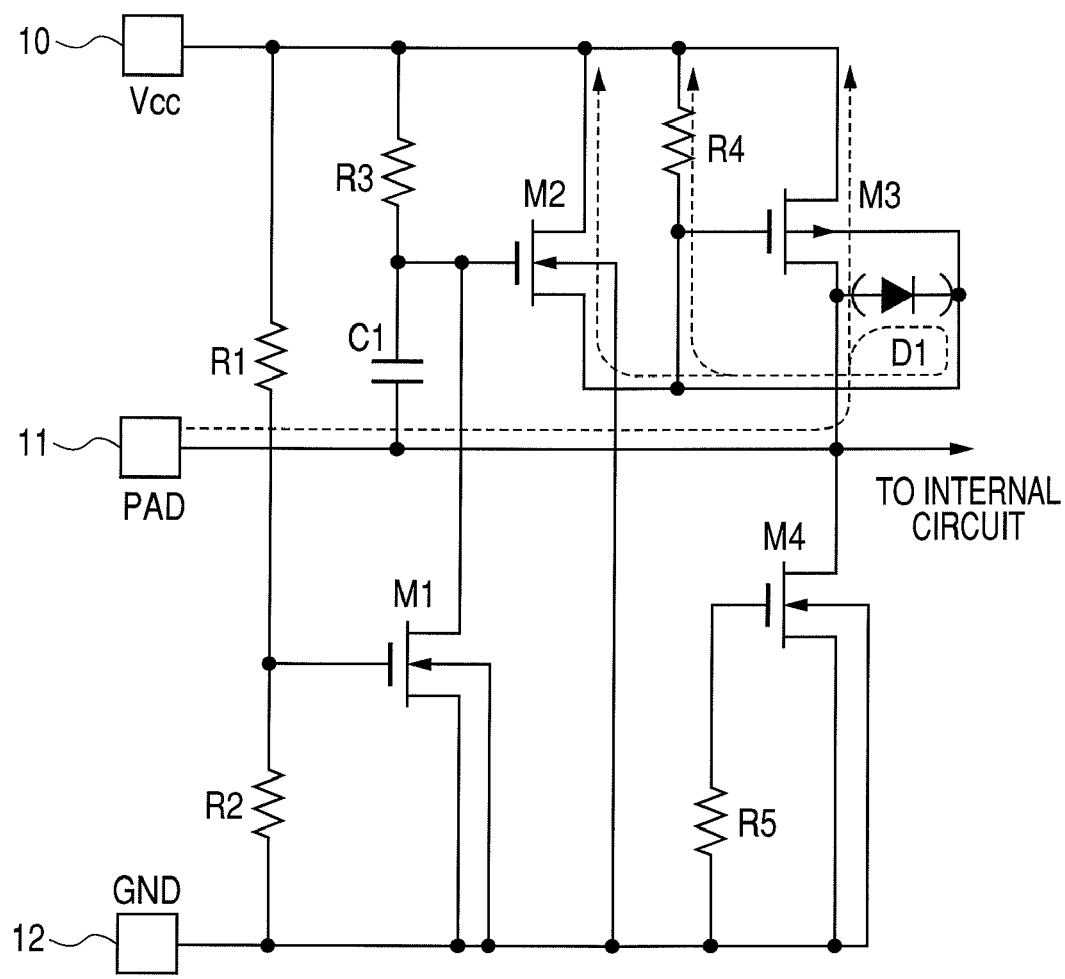
FIG. 4 is a circuit diagram illustrating the current path in the protection circuit for the semiconductor integrated circuit in the above-described example.

As illustrated in FIG. 4, a surge current is shunted to two paths. One of the paths leads through the PMOS transistor M3 to the power source pad 10 (potential is 0 V). The other path leads from the parasitic diode D1 of the PMOS transistor M3 through the NMOS transistor M2 or the resistor R4 to the power source pad 10 (potential is 0 V). That is, the protection element, including the resistor R4 and the PMOS transistor M3, is brought into a current non-limiting state. Thus, a current generated by static electricity flows through the above-described path.

Figure 5:
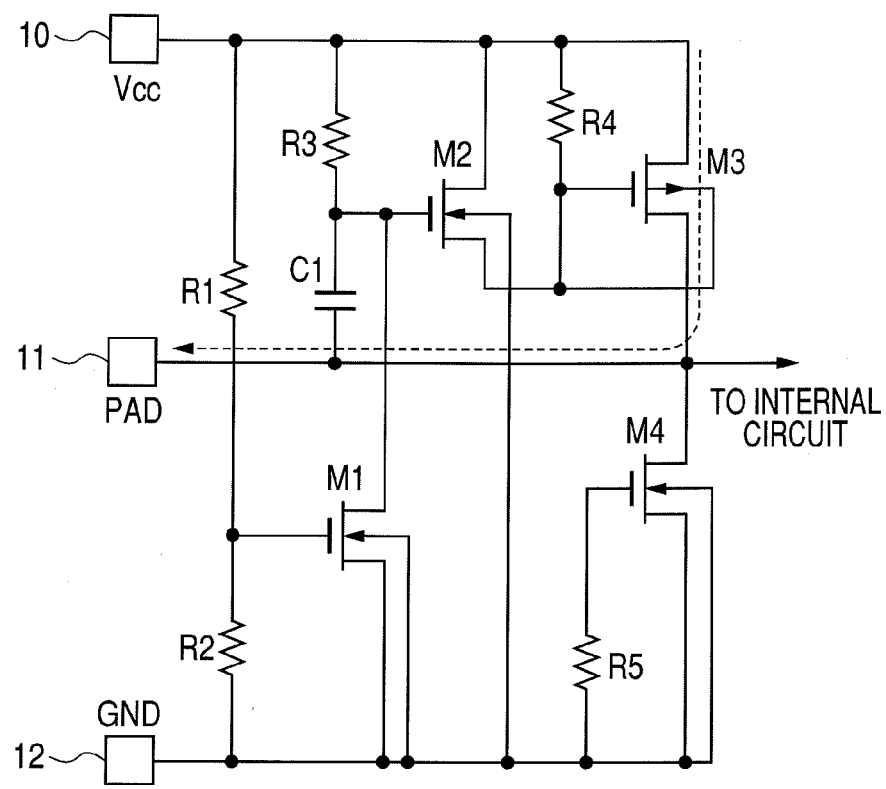
FIG. 5 is a circuit diagram illustrating the current path in the protection circuit for the semiconductor integrated circuit in the above-described example.

(4) State resulting from application of a surge that is negative with respect to Vcc in the electrostatic test time When a surge that is negative with respect to the power source pad 10 (potential is 0 V) is applied to the pad 11, the NMOS transistor M2 becomes inoperative. The negative surge is applied to the drain electrode of the PMOS transistor M3. The negative surge applied to the drain electrode causes breakdown between the drain and back gate of the PMOS transistor M3. The breakdown causes the PMOS transistor M3 to exhibit snapback characteristics. This allows a parasitic PNP transistor including a source, a back gate, and a drain to operate. Then, as illustrated in FIG. 5, a current flows from the power source pad 10 to the pad 11. That is, the protection element, including the resistor R4 and the PMOS transistor M3, is brought into the current non-limiting state. Thus, the current generated by static electricity flows through the above-described path.

Figure 9:
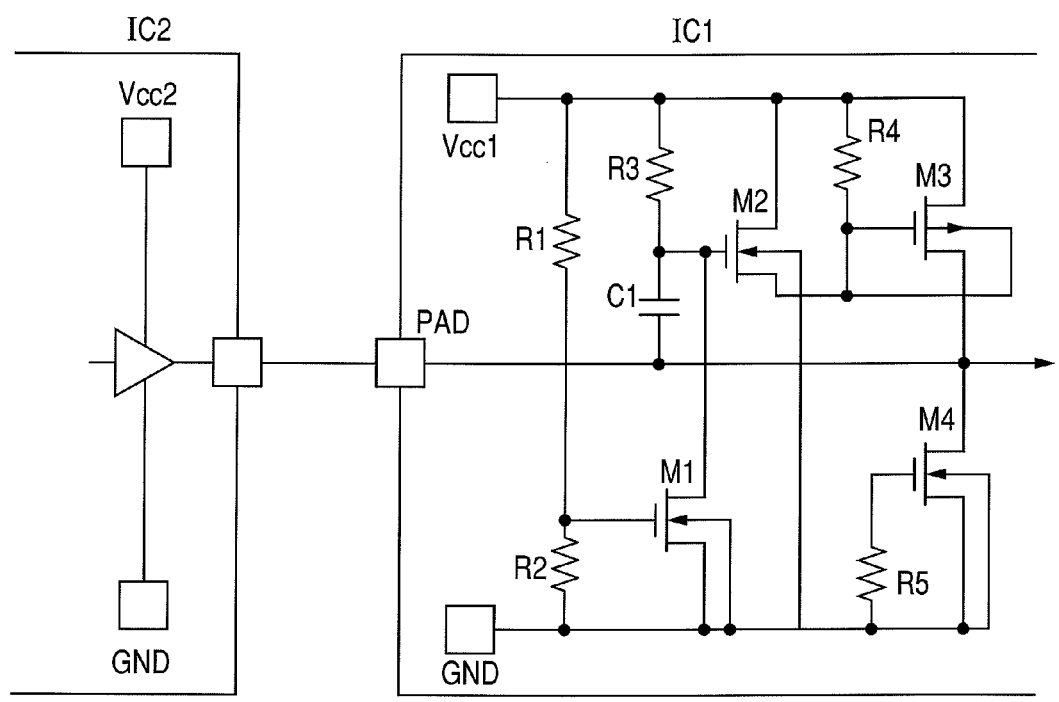
FIG. 9 is an exemplary diagram of a system comprising a protection circuit of the present invention.

FIG. 9 is an abstract diagram showing a system comprising ICs with different voltage source. The protection circuit as described above is applied to the system.

When IC1 is at the mounted-on-substrate state, ESD surge is not applied to the input of IC1, so the path for a DC current when the voltage source of IC2 is turned on prior to that of IC1 needs to be limited. This operation is the same as that in "(1) Power source non-applied state in a mounted-on-substrate state".

According to the present invention, when the power source voltage is not larger than the voltage enough to normally operate the semiconductor integrated circuit and the surge detection circuit does not detect the surge, the protection element is set in the current limiting state. This brings a current path into a high-impedance state. When the power source voltage is not larger than a voltage enough to normally operate the semiconductor integrated circuit and the surge detection circuit detects the surge, the protection element is set in the current non-limiting state. This brings the current path into a low-impedance state. Thus, the current flowing through the protection circuit can be controlled.

Example 2

Figure 6:
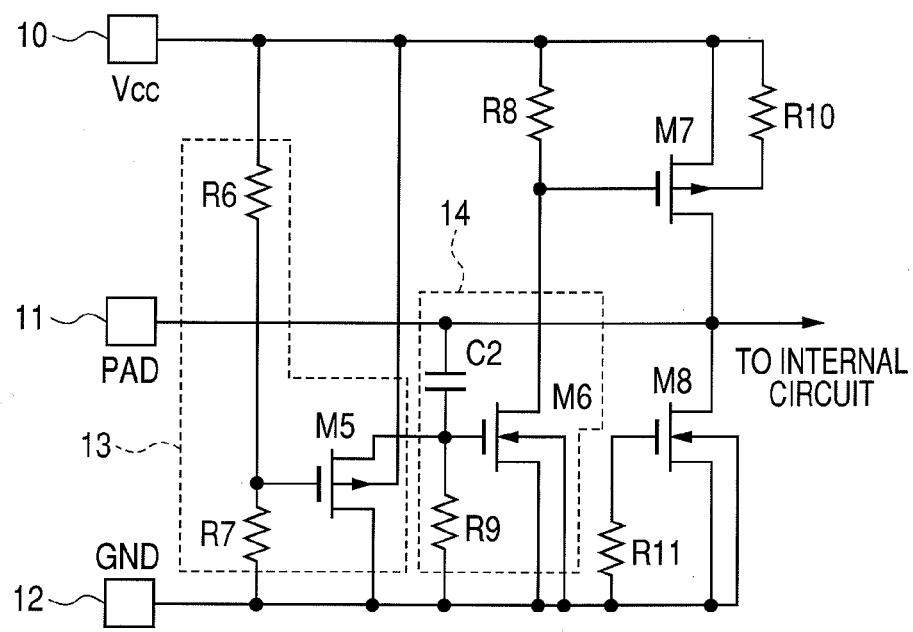
FIG. 6 is a block diagram of a second example of the protection circuit for the semiconductor integrated circuit according to the present invention.

FIG. 6 is a block diagram of a second example of the protection circuit for the semiconductor integrated circuit according to the present invention.

In FIG. 6, a power source voltage detection circuit 13 includes a resistor R6, a resistor R7 and a PMOS transistor M5. A back gate of the PMOS transistor M5 is connected to a power source pad 10. The power source voltage detection circuit 13 in the present example differs from that in the first example in that the MOS transistor provided in the power source voltage detection circuit 13 in the present example is a PMOS transistor.

A surge detection circuit 14 includes a capacitance C2, a resistor R9 and an NMOS transistor M6. In the present example, the surge detection circuit is provided between a pad 11 and a GND pad 12. A PMOS transistor M7 and a resistor R10 serve as a power source side protection element. An NMOS transistor N8 and a resistor R11 serve as a GND side protection element. A back gate of the PMOS transistor M7 is not connected to a gate thereof but to the power source pad 10 via the resistor R10. However, the back gate may be connected to the gate electrode of the PMOS transistor M7 as is the case with Example 1.

The operation of a protection circuit in the present example is similar to that in Example 1 as described below.

(1) Power Source Non-Applied State in the Mounted-on-Substrate State

As is the case with Example 1 described with reference to FIG. 2, the parasitic diode of the PMOS transistor M7 brings the protection element into the current limiting state.

(2) Power Source Applied State in the Mounted-on-Substrate State

While the power source voltage (Vcc) is being applied to the power source pad 10, the gate potential Vgm5 of the PMOS transistor M5 is:

$$Vgm5=Vcc \times R7/(R6+R7).$$

When the gate potential Vgm5 is set to at least the threshold voltage of the PMOS transistor M5, the NMOS transistor M5 is turned on. The gate potential of the NMOS transistor M6 is set to the GND level. Thus, the NMOS transistor M6 is turned off. Thus, as is the case with the first example, no current flows through the PMOS transistor M7 or the NMOS transistor M8. Furthermore, almost no current flows through a parasitic diode of the PMOS transistor M7 or the resistor R10. That is, a protection element including the resistor R10 and the PMOS transistor M7 is in the current limiting state.

(3) State Resulting from Application of a Surge that is Positive with Respect to Vcc in a Electrostatic Test Time Electrostatic tests are 2-terminal tests. If the tests are carried out with respect to Vcc (with respect to the power source pad), the power source pad 10 is set to the GND potential, and the GND pad 12 is open.

When applied to the pad 11, a surge that is positive with respect to the potential of the power source pad 10 is provided to the gate of the NMOS transistor M6 through the capacitance C2. Then, the positive surge provided to the gate allows the NMOS transistor M6 to operate. The gate potential of the PMOS transistor M7 is lowered to the GND to make the PMOS transistor M7 operative.

As is the case with Example 1, a surge current is shunted to two paths. One of the paths leads through the PMOS transistor M7 to the power source pad 10 (potential is 0 V). The other path leads from the parasitic diode of the PMOS transistor M7 through the resistor R10 to the power source pad 10 (potential is 0 V). That is, the protection element, including the resistor R10 and the PMOS transistor M7, is brought into the current non-limiting state.

(4) State Resulting from Application of a Surge that is Negative with Respect to Vcc in the Electrostatic Test Time When a surge that is negative with respect to the power source pad (potential is 0 V) is applied to the pad 11, the negative surge is applied to the drain electrode of the PMOS transistor M7. The negative surge applied to the drain electrode causes breakdown between the drain and back gate of the PMOS transistor M7. The breakdown causes the PMOS transistor M7 to exhibit snapback characteristics. This allows a parasitic PNP transistor including a source, a back gate, and a drain to operate. Then, a current flows from the power source pad 10 to the pad 11. That is, the protection element, including the resistor R10 and the PMOS transistor M7, is brought into the current non-limiting state.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2008-130828, filed May 19, 2008 and 2009-109392, filed Apr. 28, 2009, which are hereby incorporated by reference herein in their entirety.

What is claimed is:

1. A protection circuit for protecting a semiconductor integrated circuit against a surge comprising:
 a surge detecting circuit for detecting the surge applied to the semiconductor integrated circuit;
 a protecting element for absorbing the surge, the protecting element being connected between a signal terminal for supplying a signal to the semiconductor integrated circuit and a power source terminal for supplying a power source voltage; and
 a power source voltage detection circuit for detecting the power source voltage applied to the semiconductor integrated circuit,
 wherein, when the power source voltage is smaller than a voltage enough to normally operate the semiconductor integrated circuit and the surge detecting circuit does not detect the surge, the protecting element is set at a current limiting state, and
 wherein, when the power source voltage is smaller than a voltage enough to normally operate the semiconductor integrated circuit and the surge detecting circuit detects the surge, the protecting element is set at a current non-limiting state, and
 wherein, when the power source voltage detection circuit detects that the power source voltage is not lower than the voltage enough to normally operate the semiconductor integrated circuit, a power source voltage detection signal is output to the surge detecting circuit, to set the surge detecting circuit at a non-detecting state, such that the surge detecting circuit sets the protection element at a current limiting state.

2. A protection circuit for protecting a semiconductor integrated circuit against a surge comprising:
 a surge detecting circuit for detecting the surge applied to the semiconductor integrated circuit; and
 a protecting element for absorbing the surge, the protecting element being connected between a signal terminal for supplying a signal to the semiconductor integrated circuit and a power source terminal for supplying a power source voltage,
 wherein the protecting element comprises a PMOS transistor having a drain connected to the signal terminal and a source connected to the power source terminal, and having its gate and its back gate commonly connected, and
 a resistor having one terminal connected to the power source terminal and the other terminal connected to the gate of the PMOS transistor and to an output of the surge detection circuit, and
 wherein, when the power source voltage is not larger than a voltage enough to normally operate the semiconductor integrated circuit and the surge detecting circuit does not detect the surge, the protecting element is set at a current limiting state, and
 wherein, when the power source voltage is not larger than a voltage enough to normally operate the semiconductor integrated circuit and the surge detecting circuit detects the surge, the protecting element is set at a current non-limiting state.

3. A system comprising:
 a first semiconductor integrated circuit, and
 a second semiconductor integrated circuit having a signal input from the first semiconductor integrated circuit,
 the second semiconductor integrated circuit comprising a protection circuit for protecting a surge comprising:
 a surge detecting circuit for detecting the surge applied to the first semiconductor integrated circuit;
 a protecting element for absorbing the surge, the protecting element being connected between a signal terminal for supplying a signal to the first semiconductor integrated circuit and a power source terminal for supplying a power source voltage; and
 a power source voltage detection circuit for detecting the power source voltage applied to the semiconductor integrated circuit,
 wherein, when the power source voltage is smaller than a voltage enough to normally operate the first semiconductor integrated circuit and the surge detecting circuit does not detect the surge, the protecting element is set at a current limiting state, and
 wherein, when the power source voltage is smaller than a voltage enough to normally operate the first semiconductor integrated circuit and the surge detecting circuit detects the surge, the protecting element is set at a current non-limiting state, and wherein, when the power source voltage detection circuit detects that the power source voltage is not lower than a voltage enough to normally operate the first semiconductor integrated circuit, a power source voltage detection signal is output to the surge detecting circuit, to set the surge detecting circuit at a non-detecting state, such that the surge detecting circuit sets the protecting element at a current limiting state.

4. A driving method of a protecting circuit for absorbing a surge applied to a semiconductor integrated circuit, wherein the protecting circuit is arranged between a signal terminal for supplying a signal to the semiconductor integrated circuit and a power source terminal for supplying a power source voltage, wherein, when the power source voltage is smaller than a voltage enough to normally operate the semiconductor integrated circuit and the surge detecting circuit does not detect the surge, the protecting circuit is set at a current limiting state, and when the power source voltage is smaller than a voltage enough to normally operate the semiconductor integrated circuit and the surge detecting circuit detects the surge, the protecting circuit is set at a current non-limiting state, and wherein the protecting circuit further comprises a power source voltage detection circuit for detecting the power source voltage applied to the semiconductor integrated circuit, and wherein, when the power source voltage detection circuit detects that the power source voltage is not lower than the voltage enough to normally operate the semiconductor integrated circuit, a power source voltage detection signal is output to the surge detecting circuit, to set the surge detecting circuit at a non-detecting state, such that the surge detecting circuit sets the protection element at a current limiting state.

5. A system comprising:
a first semiconductor integrated circuit; and
a second semiconductor integrated circuit having a signal input from the first semiconductor integrated circuit, and the second semiconductor integrated circuit comprising a protection circuit for protecting against a surge comprising:
a surge detecting circuit for detecting the surge applied to the first semiconductor integrated circuit;
a protecting element for absorbing the surge, the protecting element being connected between a signal terminal for supplying a signal to the first semiconductor integrated circuit and a power source terminal for supplying a power source voltage, wherein the protecting element comprises a PMOS transistor having a drain connected to the signal terminal and a source connected to the power source terminal, and having its gate and its back gate commonly connected, and a resistor having one terminal connected to the power source terminal and the other terminal connected to the gate of the PMOS transistor and to an output of the surge detection circuit, wherein, when the power source voltage is not larger than a voltage enough to normally operate the first semiconductor integrated circuit and the surge detecting circuit does not detect the surge, the protecting element is set at a current limiting state, and wherein, when the power source voltage is not larger than a voltage enough to normally operate the first semiconductor integrated circuit and the surge detecting circuit detects the surge, the protecting element is set at a current non-limiting state.

6. A driving method of a protecting circuit for absorbing a surge applied to a semiconductor integrated circuit, wherein the protecting circuit is arranged between a signal terminal for supplying a signal to the semiconductor integrated circuit and a power source terminal for supplying a power source voltage, wherein, when the power source voltage is not larger than a voltage enough to normally operate the semiconductor integrated circuit and the surge detecting circuit does not detect the surge, the protecting circuit is set at a current limiting state, and wherein, when the power source voltage is not larger than a voltage enough to normally operate the semiconductor integrated circuit and the surge detecting circuit detects the surge, the protecting circuit is set at a current non-limiting state, and wherein the protecting circuit includes a PMOS transistor having a drain connected to the signal terminal and a source connected to the power source terminal, and having its gate and its back gate commonly connected, and a resistor having one terminal connected to the power source terminal and the other terminal connected to the gate of the PMOS transistor and to an output of the surge detection circuit.

* * * * *